(12) United States Patent
Petruzzello et al.

(10) Patent No.: US 7,485,916 B2
(45) Date of Patent: Feb. 3, 2009

(54) DYNAMIC CONTROL OF CAPACITANCE ELEMENTS IN FIELD EFFECT STRUCTURES

(75) Inventors: John Petruzzello, Carmel, NY (US); Theodore Letavic, Putnam Valley, NY (US); Benoit Dufort, Croton-On-Hudson, NY (US)

(73) Assignee: NXP, B.V., Eindhoven (NL)

( * ) Notice: Subject to any disclaimer, the term of this patent is extended or adjusted under 35 U.S.C. 154(b) by 232 days.

(21) Appl. No.: 10/572,924

(22) PCT Filed: Sep. 21, 2004

(86) PCT No.: PCT/IB2004/051809

§ 371 (c)(1),
(2), (4) Date: Mar. 22, 2006

(87) PCT Pub. No.: WO2005/029586

PCT Pub. Date: Mar. 31, 2005

(65) Prior Publication Data

US 2007/0080389 A1 Apr. 12, 2007

Related U.S. Application Data

(60) Provisional application No. 60/504,997, filed on Sep. 22, 2003.

(51) Int. Cl.
*H01L 29/94* (2006.01)

(52) U.S. Cl. ............... 257/312; 257/488; 257/E29.317
(58) Field of Classification Search ................. 257/488, 257/312
See application file for complete search history.

(56) References Cited

U.S. PATENT DOCUMENTS

| | | | | | |
|---|---|---|---|---|---|
| 4,614,959 | A | * | 9/1986 | Nakagawa | 257/409 |
| 4,926,243 | A | * | 5/1990 | Nakagawa et al. | 257/659 |
| 5,434,445 | A | * | 7/1995 | Ravanelli et al. | 257/488 |
| 5,973,341 | A | * | 10/1999 | Letavic et al. | 257/287 |
| 6,051,895 | A | * | 4/2000 | Mercier | 307/125 |
| 6,100,571 | A | * | 8/2000 | Mizuta et al. | 257/488 |
| 6,614,088 | B1 | | 9/2003 | Beasom | |
| 2002/0033508 | A1 | | 3/2002 | Morikawa | |
| 2002/0043699 | A1 | * | 4/2002 | Akiyama | 257/575 |
| 2002/0079521 | A1 | | 6/2002 | Lin | |

* cited by examiner

*Primary Examiner*—Minh-Loan T Tran
*Assistant Examiner*—Selim Ahmed
(74) *Attorney, Agent, or Firm*—Peter Zawilski

(57) ABSTRACT

A field effect device includes at least one segmented field plate, each of the at least one segmented field plates having a plurality of segments that each form a plate of a capacitor, wherein the field effect device is connected to an electronic element that dynamically connects selected segments to selectively set a gate-to-drain and a drain-to-source capacitance. An ultrasonic device includes a transducer coupled to a switching device that switches the transducer between a transmit mode and a receive mode switching device, wherein the switching device includes the field effect device.

21 Claims, 3 Drawing Sheets

DYNAMIC CONTROL OF CAPACITANCE ELEMENTS IN FIELD EFFECT STRUCTURES

CROSS REFERENCE TO RELATED APPLICATION

This application claims the benefit of U.S. provisional application Ser. No. 60/504,997 filed Sep. 22, 2003 which is incorporated herein in whole by reference.

The capacitance of various elements of a field effect device, such as silicon based metal oxide field effect transistors (MOSFET), can impact the performance of the device. For example, the capacitance of various elements can impact the switching speed of the device, and, as such, the transient response of the device. Accordingly, it is useful to control the capacitance of the elements of the device.

Moreover, in some applications, it is beneficial to be able to dynamically control the capacitance of particular elements of a field effect transistor. For example, in high-voltage (HV) transistors it may be beneficial to change in a dynamic manner the gate-to-drain capacitance ($C_{GD}$), or the drain-to-source capacitance ($C_{DS}$), or both, or to change the ratio of $C_{GD}/C_{DS}$ (hereinafter often referred to as 'the ratio') by altering one or both capacitance elements.

One application in which it may be useful to dynamically alter the ratio is in ultrasonic equipment, such as imaging equipment based on ultrasonic technology. This technology is often employed in medical testing equipment. In many ultrasonic-based imaging devices there are transducers that are coupled to an electronic transmitter and an electronic receiver. The transducers are relatively high-voltage devices, and the receiver often is necessarily very sensitive to foster improved resolution in the image.

While this sensitivity is useful in improving the image resolution, it renders the receivers susceptible to transient electrical pulses. In order to address this susceptibility, it is necessary to ensure the receiver is isolated during the transmission of the relatively high HV transmit signal. Moreover, the switch itself must be controlled so that when it switches 'on' the receiver, the pulse from the switch is not too great so undesired images are avoided. In order to achieve this, it is necessary to control the ratio during fabrication of the MOSFET-based HV switch.

As is known, each transducer has its own electrical characteristics, and if a transducer is changed for a particular application, the ratio must also be changed. In known technology, the ratio is a static value. Unfortunately, the value of the ratio in known HV field effect devices is dictated by the device layout, with little or no control by the device designer. Accordingly, the switching behavior of the device, including its transient response is difficult to optimize for a particular transducer, since the ratio is fixed.

Accordingly, what is needed is a field-effect device that is capable of dynamic variation of the ratio ($C_{GD}/C_{DS}$).

According to an example embodiment, a field effect device includes at least one segmented field plate, each of the at least one segmented field plates having a plurality of segments that each form a plate of a capacitor, wherein the field effect device is connected to an electronic element that dynamically connects selected segments to selectively set a gate-to-drain and a drain-to-source capacitance.

According to an example embodiment, an ultrasonic device includes a transducer coupled to a switching device that switches the transducer between a transmit mode and a receive mode switching device, wherein the switching device includes a field effect device that includes at least one segmented field plate, each of the at least one segmented field plates having a plurality of segments that each form a plate of a capacitor; and wherein the field effect device is connected to an electronic element that dynamically connects selected segments to selectively set a gate-to-drain and a drain-to-source capacitance.

The invention is best understood from the following detailed description when read with the accompanying drawing figures. It is emphasized that the various features are not necessarily drawn to scale. In fact, the dimensions may be arbitrarily increased or decreased for clarity of discussion.

In the following detailed description, for purposes of explanation and not limitation, example embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Briefly, the example embodiments relate to a field effect device and its implementation as a switching element having a dynamically variable $C_{GD}$ and $C_{DS}$, and therefore a dynamically variable ratio $C_{GD}/C_{DS}$. The dynamic variability is effected by the selective connection of segments to the gate and source. This is achieved by use of a multiplexing device or similar device. In one example embodiment, the switching element is used in switching between the transmit function and receive function of an ultrasonic transducer. Characteristically, the switching element can be used in two regimes. In a first regime the ratio $C_{GD}/C_{DS}$ can be changed during turn-on of the switching element to minimize charge injection, and in a second to dynamically select a particular $C_{GD}/C_{DS}$ for each transducer to optimize the quality of the received signal from the transducer. These and other details will become clearer as the present description of example embodiments continues.

Figure 1:
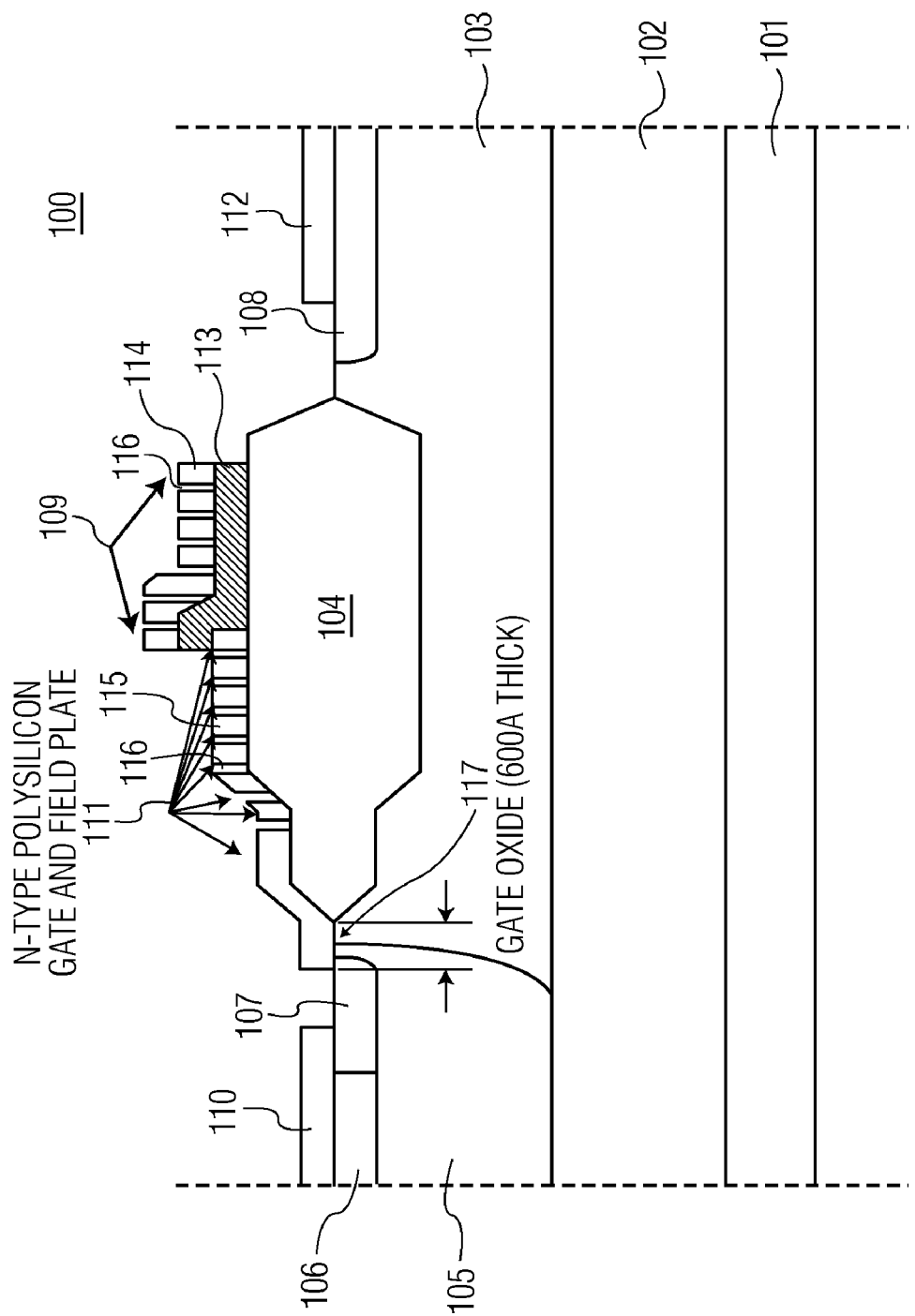
FIG. 1 is a cross-sectional view of a field effect transistor in accordance with an example embodiment.

FIG. 1 shows a field effect device 100 in accordance with an example embodiment. In the example embodiment of FIG. 1, the device is a HV semiconductor-on-insulator (SOI), which is silicon-based. It is noted that this is merely illustrative, and other example embodiments may be from other materials/technologies. For example, the device may be a lateral double-diffused MOS (LDMOS) structure as shown. Alternatively, the device may be another type of HV field effect structure such as a lateral junction FET or diode. The semiconductor-base of the devices may be silicon, silicon-germanium (Si—Ge), or III-V material, such as GaAs. Finally, the concepts of the example embodiments can be used for devices with breakdown voltages greater than approximately 100V.

Many aspects of the device 100 are well-known of one skilled in the semiconductor device and fabrication arts. As such, unless described otherwise, the fabrication techniques, materials and doping levels, being well-known to one skilled in the art, are omitted so as to not obscure the description of the embodiments.

The device 100 includes a substrate 101, such as monocrystalline silicon. As the device 100 is an SOI device, a buried oxide layer is disposed over the substrate 101 and is formed by standard fabrication methods. A bulk Si layer 103 is disposed over the SOI layer 102, and is the n⁻-type drift region of the illustrative device 100. A field oxide is disposed over the n⁻-drift layer 103. A p⁻-type body 105 has a p⁺ body contact 106 is formed in contact with the p⁻ body 105. Adjacent to the p⁺ body contact 106 is the n⁺ source 107, which has a source metallization 110 as shown. An n⁺ drain 108 is disposed as shown and has a drain metallization 112 thereover. A field plate 109 is segmented as referenced above, having segments 114 and is illustratively metal, and a gate doped-polysilicon (poly) field plate 111 is similarly segmented, having segments 115. Finally, a dielectric layer 113, such as silicon nitride is disposed beneath the poly field plate 111.

The segments are fabricated by known patterning and etching techniques. Illustratively, the spacing 116 between the segments 114 and 115 are on the order of 2.0 µm allowing the connection to the source or gate contacts without degradation of the device operation. The segments 114 and 115 can have widths in the range of approximately 2.0 µm to less than that of an integral field plate (non-segmented), which is on the order of approximately 50 µm. The number of segments 114 and 115 dictates the variability of the capacitance values as well as the maximum value of each $C_{GD}$ and $C_{DS}$. The segments 114 electrically connected to the gate will contribute to $C_{GD}$, while segments 115 connected to the source will contribute to the $C_{DS}$.

As described in further detail herein, the field plate 109 and the poly field plate 111 are segmented to enable the selective connection of each segment of the field plates to the drain contact 112, or the source contact 110. The selective connection of the segments 114 and 115 enables the control of capacitive components $C_{GD}$ and $C_{DS}$, respectively. Of course, this allows the selective increase of one or both of these components by increasing the area of a plate of the capacitor. Naturally, the ratio $C_{GD/CDS}$ can be varied by this selection.

Figure 2:
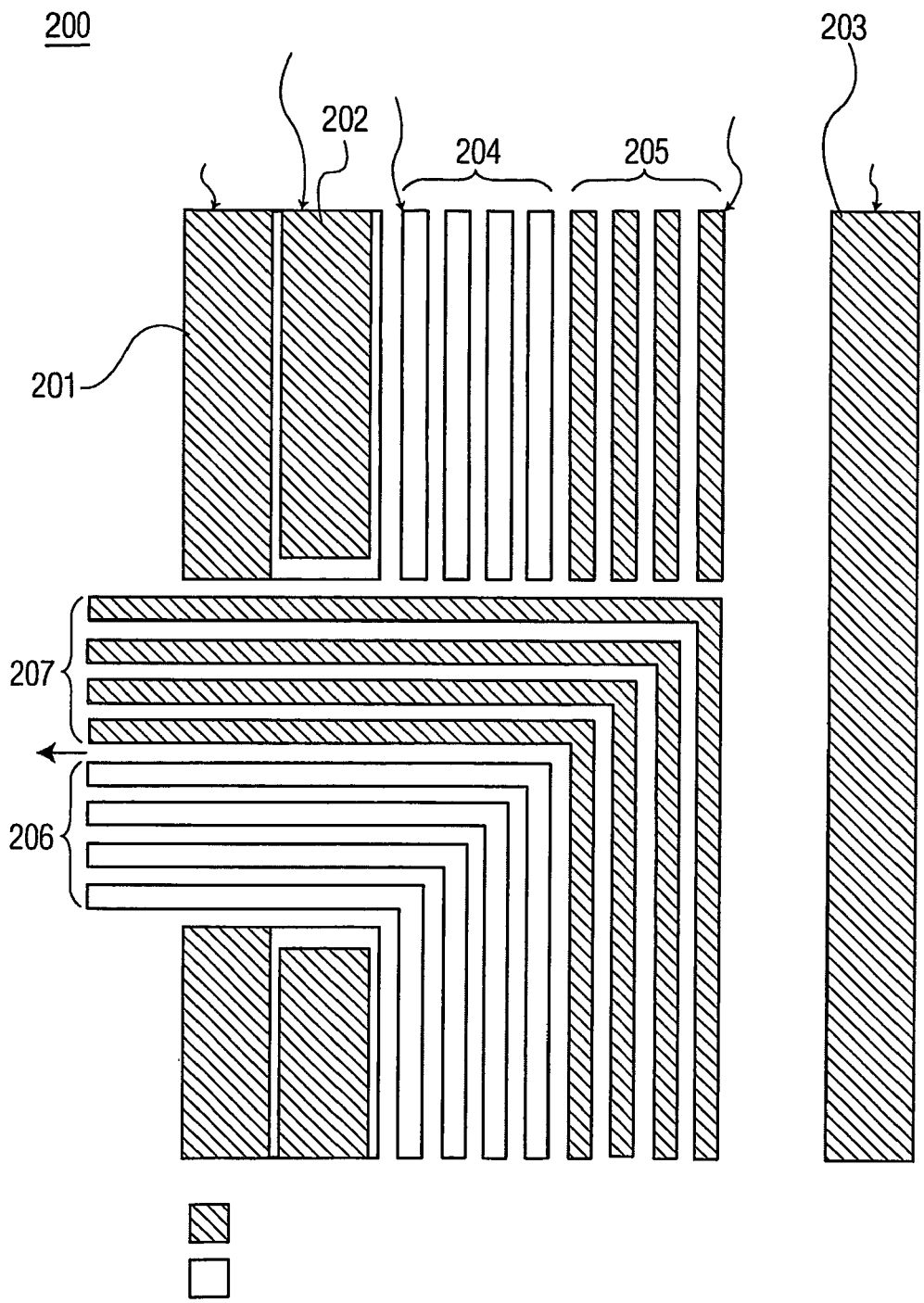
FIG. 2 is a top-view of a connection pattern in accordance with an example embodiment.

FIG. 2 is a top view of a contact pattern 200 of a field effect device such as device 100 in accordance with an example embodiment. Of course in practice, a plurality of such devices may be on a single chip. In the interest of clarity only one will be discussed in detail. Source 201, gate 202 and drain 203 contacts are as shown. A segmented gate field plate 204 is illustratively doped polysilicon, and a segmented field plate 205 is illustratively a suitable contact metal within the purview of the artisan of ordinary skill in semiconductor device processing and design. Connections to the selected segments of segmented field plates 204 and 205 to achieve a certain value of $C_{GD}$ or $C_{DS}$ and/or a particular value of the ratio are effected via contacts 206 and 207, respectively. These contacts 206 and 207 are connected to a control circuit, not shown in FIG. 2, which effects the selective connections.

Figure 3:
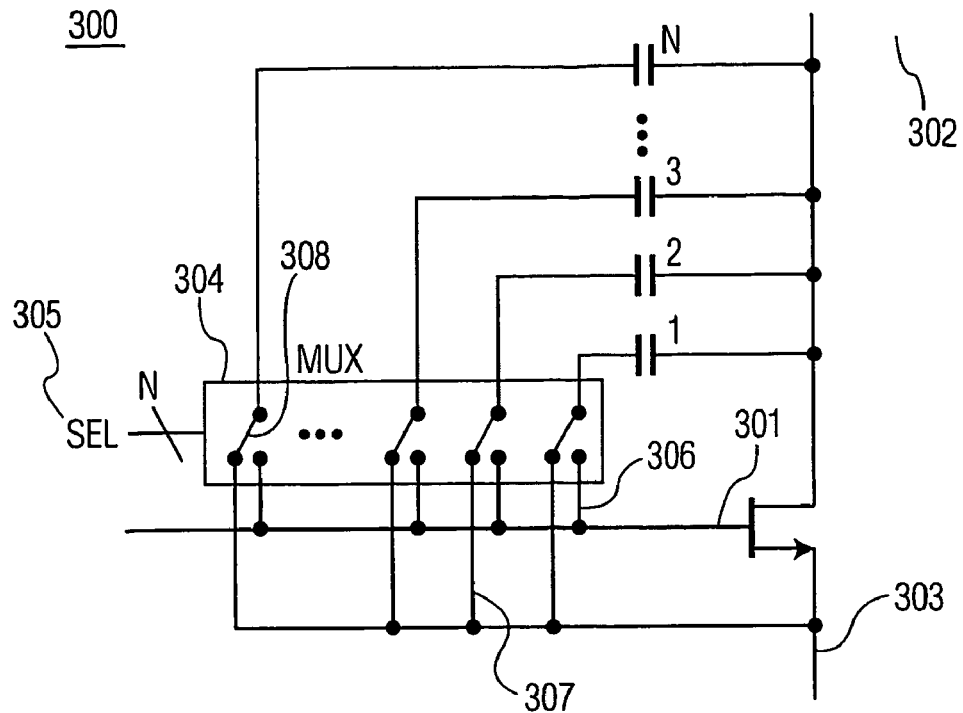
FIG. 3 is an equivalent circuit diagram of a circuit in accordance with an example embodiment.

FIG. 3 shows is schematic diagram of an exemplary control circuit 300 that is useful in effecting the connections to certain segments of the field plates of a field effect device to dynamically control the capacitances $C_{GD}$, $C_{DS}$ and/or a particular value of the ratio. A gate 301, a drain 302 and a source 303 are as shown in FIG. 1. Connections to the contacts to the segmented field plate of the gate (e.g., segmented field plate 115) are effected by contacts 306 (corresponding to contacts 206 in FIG. 2) and connections to the segmented field plate over the gate (e.g., segmented field plate 114) are effected by contacts 307 (corresponding to contacts 207). The contacts 306 and 307 are connected selectively by a multiplexor 304 (MUX), which receives an input from selector 305. The MUX 305 illustratively includes transistors that have a breakdown voltage that is greater than the gate-to-source voltage, which is usually 14 V.

The selector 305 receives the connection information of which of a plurality of switch elements 308 of the MUX 304 should be connected and to which contact in order to effect the desired values of $C_{GD}$, $C_{DS}$ and/or a particular value of the ratio. In an exemplary embodiment in which the input to the selector 305 is from a transducer of an ultrasonic device, the transducer electronics is adapted to provide the connection information to the selector 305.

In an example embodiment, the value of $C_{GD}$ is minimized to a significant degree. This is exceedingly beneficial in applications where the device 100 performs a switching function. To this end, the greater the value of $C_{GD}$, the more significant the switching losses. As is known, switching losses can result in heating of the device and/or chip and can limit performance of the circuit. Thus, it is useful to reduce the value of $C_{GD}$ to an acceptable level, which can be accomplished by reducing the area of field plate 109 by connecting to fewer segments 114.

In another example embodiment, it is beneficial to optimize the ratio $C_{GD}/C_{DS}$ by increasing $C_{GD}$ and decreasing $C_{DS}$. Of course, this is effected by connecting to relatively fewer of segments 114 and more of segments 115. This embodiment is illustratively applicable in switching to a transmit mode and turning off the transmit mode to protect a receiver during operation of the transmitter. Moreover, the HV pulses that can be emitted by the switch can be reduced significantly via this embodiment, thereby reducing false receptions at the receiver.

One example in which the optimization of the ratio is beneficial is in the field of ultrasonic imaging. As referenced above, damage to the receiver and false images can be substantially avoided by controlling the ratio. The field effect device 100 may be used in the transmit/receive (TR) switch circuit. Because the frequency response of each transducer is different, according to an example embodiment the ratio $C_{GD}/C_{DS}$ is changed for each transducer element so that a substantially optimal ratio is chosen for each individual transducer allowing the transducer to optimally function. Ultimately, this fosters a reduction in the errant HV pulse that can be sent by the switch when it is turned to an 'on' state when it is desired to turn the receiver of the ultrasonic device on to receive a signal from the transducer. Of course, this signal is converted to an electrical signal by the electronic elements of the receiver and is used to form an image of the object probed by the transducer.

Figure 4:
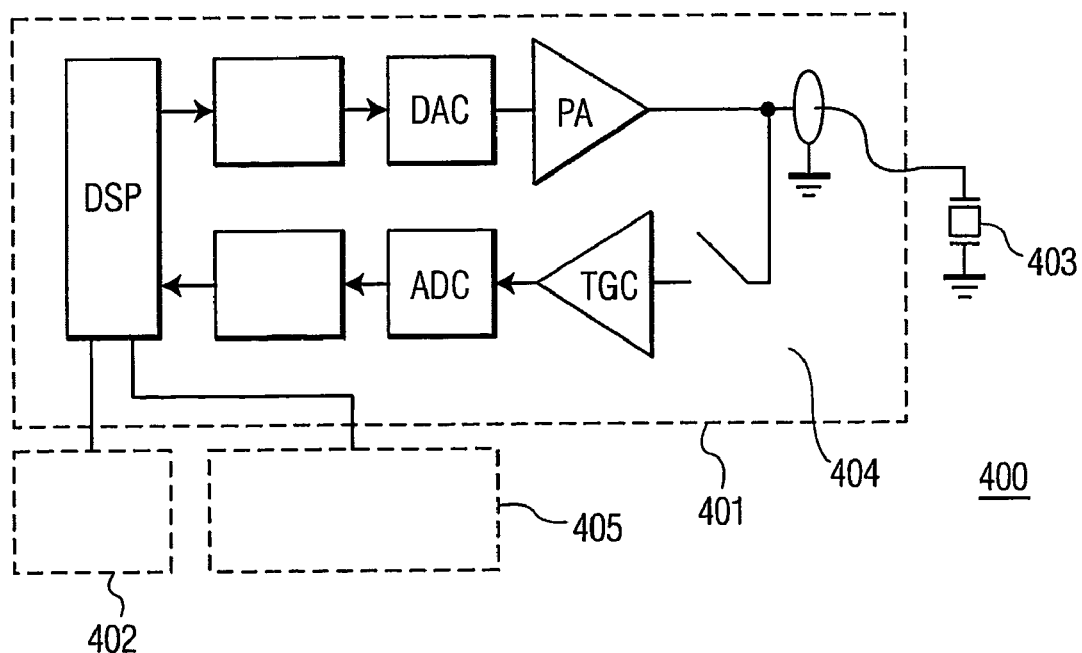
FIG. 4 is a schematic view of an ultrasonic device in accordance with an example embodiment.

An ultrasonic imaging device 400 according to example embodiment is shown in schematic form in FIG. 4. It is noted that the details of the transmission, reception and imaging of the device 400 is, for the most part, outside the scope of the present disclosure. However, a significant benefit of the field effect device of the switch of the present example embodiment lies in the ability to substantially reduce errant HV pulses from being emitted by the field effect device by controlling the ratio. In one example embodiment, this is achieved by increasing $C_{GD}$ and decreasing $C_{DS}$, while in another example embodiment the ratio is optimized for each transducer. Thereby, with one switching device a plurality of transducers may be used, each having a different frequency response and ratio requirement for the switch. As such the need to compromise on the quality of the received signal when transducers are interchanged for different situations, or to unnecessarily limit the number of transducers that can be used with the ultrasonic device.

The ultrasonic imaging device 400 includes an ultrasonic electronics module 401, an imaging display 402, a transducer 403, and a keyboard/entry device 405. The ultrasonic electronics module 401 includes a transmitter, a receiver, a switching element and a control circuit for the switching element. The switching element may include a transmit/receive (TR) switch incorporating a semiconductor device such as the field effect device 100 described above. The various elements of the electronics module are as described above in connection with various example embodiments. The transducer 403 is one of a plurality of interchangeable transducers that can used in keeping with the example embodiments. As described in detail above, each transducer 403 has a certain requirement for the ratio and/or the components thereof. These requirements are input to the control circuit as described above to optimize the performance of the transducer and the receiver. Finally, the imaging display 402 is a known device in ultrasonic imaging.

The example embodiments having been described in detail in connection through a discussion of exemplary embodiments, it is clear that modifications of the invention will be apparent to one having ordinary skill in the art having had the benefit of the present disclosure. Such modifications and variations are included in the scope of the appended claims.

The invention claimed is:

1. A field effect device, comprising:
a gate; a source; and at least one segmented field plate, each of the at least one segmented field plates having a plurality of segments that each form a plate of a capacitor, wherein the field effect device selects first and second groups of segments of the plurality of segments in response to a selection signal and connects the first group of segments to the gate and the second group of segments to the source to selectively set a gate-to-drain ($C_{GD}$) and a drain-to-source ($C_{DS}$) capacitance.

2. A field effect device as recited in claim 1, wherein the at least one segmented field plate further comprises a first segmented field plate and a second segmented field plate.

3. A field effect device as recited in claim 1, wherein the field effect device is a metal-oxide-semiconductor field effect transistor (MOSFET).

4. A field effect device as recited in claim 2, wherein the second field plate is at least partially disposed over the first field plate.

5. A field effect device as recited in claim 4, wherein a dielectric layer is disposed between the first and the second segmented field plates at a location where the second field plate partially overlaps the first field plate.

6. A field effect device as recited in claim 3, wherein the field effect device is a semiconductor-on-insulator structure.

7. A field effect device as recited in claim 1, wherein the field effect device is a semiconductor transistor, and the semiconductor is one of silicon, silicon-germanium or a III-V semiconductor material.

8. A field effect device as recited in claim 1, wherein a ratio of the $C_{GD}$ to the $C_{DS}$ is controlled responsive to the selection signal.

9. A field effect device as recited in claim 8, wherein the ratio is in the range of approximately 0.3 to approximately less than 0.9.

10. A field effect device as recited in claim 1, wherein the field effect device is a component of an electrical switch.

11. An ultrasonic device, comprising:
a transducer coupled to a switching device that switches the transducer between a transmit mode and a receive mode, wherein the switching device includes a field effect device that includes a gate, a source and at least one segmented field plate, each of the at least one segmented field plates having a plurality of segments that each form a plate of a capacitor, and wherein the field effect device selects first and second groups of segments of the plurality of segments in response to a selection signal and connects the first group of segments to the gate and the second group of segments to the source to selectively set a gate-to-drain ($C_{GD}$) and a drain-to-source capacitance ($C_{DS}$).

12. An ultrasonic device as recited in claim 11, wherein the transducer optimally operates at a particular ratio of $C_{GD}$ to $C_{DS}$, and the first and second groups of segments are connected to the gate and the source to realize the particular ratio.

13. An ultrasonic device as recited in claim 11, wherein the ultrasonic device is adapted to connect to any of a plurality of transducers, each of which optimally operates at one of a particular ratio $C_{GD}$ to $C_{DS}$, and the first and second groups of segments are connected to the gate and the source to realize the particular ratio for one of said plurality of transducers when in use with the ultrasonic device.

14. An ultrasonic device as recited in claim 11, wherein the at least one segmented field plate further comprises a first segmented field plate and a second segmented field plate.

15. An ultrasonic device as recited in claim 11, wherein the field effect device is a metal-oxide-semiconductor field effect transistor (MOSFET).

16. An ultrasonic device as recited in claim 13, wherein the second segmented field plate is at least partially disposed over the first field plate.

17. An ultrasonic device as recited in claim 15, wherein a dielectric layer is disposed between the first and the second segmented field plates at a location where the second field plate partially overlaps the first field plate.

18. An ultrasonic device as recited in claim 14, wherein the field effect device is a semiconductor-on-insulator structure.

19. An ultrasonic device as recited in claim 11, wherein the field effect device is a semiconductor transistor, and the semiconductor is one of silicon, silicon-germanium or a III-V semiconductor material.

20. An ultrasonic device as recited in claim 11, wherein the first and second groups of segments are selected based on an input from the transducer.

21. An ultrasonic device as recited in claim 11, wherein the $C_{GD}$ is less than the $C_{DS}$.

* * * * *